US011674982B2

(12) United States Patent
Morioka et al.

(10) Patent No.: US 11,674,982 B2
(45) Date of Patent: Jun. 13, 2023

(54) VOLTAGE DETECTION UNIT

(71) Applicants: YAZAKI CORPORATION, Tokyo (JP); TOYOTA JIDOSHA KABUSHIKI KAISHA, Toyota (JP); KABUSHIKI KAISHA TOYOTA JIDOSHOKKI, Kariya (JP)

(72) Inventors: Satoshi Morioka, Okazaki (JP); Motoyoshi Okumura, Nagoya (JP); Hiromi Ueda, Kariya (JP); Naoto Morisaku, Kariya (JP); Yutaro Okazaki, Kakegawa (JP); Shinichi Yanagihara, Kakegawa (JP)

(73) Assignees: YAZAKI CORPORATION, Tokyo (JP); TOYOTA JIDOSHA KABUSHIKI KAISHA, Toyota (JP); KABUSHIKI KAISHA TOYOTA JIDOSHOKKI, Kariya (JP)

( * ) Notice: Subject to any disclaimer, the term of this patent is extended or adjusted under 35 U.S.C. 154(b) by 0 days.

(21) Appl. No.: 17/732,069

(22) Filed: Apr. 28, 2022

(65) Prior Publication Data
US 2022/0349923 A1 Nov. 3, 2022

(30) Foreign Application Priority Data

Apr. 30, 2021 (JP) .............................. JP2021-078144

(51) Int. Cl.
*G01R 19/00* (2006.01)
*G01R 1/04* (2006.01)
(52) U.S. Cl.
CPC ........... *G01R 19/0084* (2013.01); *G01R 1/04* (2013.01)

(58) Field of Classification Search
CPC .................... G01R 19/00; G01R 19/0084; G01R 19/0092; G01R 1/00; G01R 1/02;
(Continued)

(56) References Cited

U.S. PATENT DOCUMENTS

| 2022/0349922 A1* | 11/2022 | Okazaki | ............. G01R 19/0084 |
| 2022/0349945 A1* | 11/2022 | Morioka | ............. H01M 50/298 |
| 2022/0349946 A1* | 11/2022 | Morioka | ............. H01M 50/298 |

FOREIGN PATENT DOCUMENTS

| CN | 112928323 A | * | 6/2021 | ............. B60L 58/30 |
| CN | 213398702 U | * | 6/2021 | ............. G01R 19/00 |

(Continued)

*Primary Examiner* — Hoai-An D. Nguyen
(74) *Attorney, Agent, or Firm* — Sughrue Mion, PLLC

(57) ABSTRACT

A voltage detection unit includes a voltage detection terminal, a housing including a terminal accommodating concave and a cover to be attached to the housing and to cover the voltage detection terminal accommodated in the terminal accommodating concave. The cover includes an extension piece extending in a first direction. The housing includes an accommodating hole to accommodate the extension piece, and a guide portion including an inclined surface and a guide surface. The inclined surface has a first end in the first direction and a second end and is inclined with respect to the first direction such that the first end is provided closer to the accommodating hole than the second end in a second direction perpendicular to the first direction and being parallel to the housing. The guide surface is continuous with the inclined surface and an inner wall surface of the accommodating hole.

3 Claims, 9 Drawing Sheets

(58) Field of Classification Search
CPC .......... G01R 1/04; G01R 31/00; G01R 31/36; G01R 31/3644; G01R 15/00; G01R 15/12; G01R 15/14; G01R 15/144; Y02E 60/00; Y02E 60/10
USPC .... 324/76.11, 126, 600, 649, 691, 713, 522; 702/1, 57, 64
See application file for complete search history.

(56) References Cited

FOREIGN PATENT DOCUMENTS

| | | | | | |
|---|---|---|---|---|---|
| CN | 111521852 | B | * | 8/2022 | ............. G01R 11/24 |
| JP | 2015072145 | A | * | 4/2015 | ............. G01R 31/02 |
| JP | 5988945 | B2 | * | 9/2016 | ............. G01R 31/02 |
| JP | 2020-161340 | A | | 10/2020 | |

* cited by examiner

VOLTAGE DETECTION UNIT

CROSS-REFERENCE TO RELATED APPLICATION

The present application claims priority to Japanese Patent Application No. 2021-078144 filed on Apr. 30, 2021, the entire content of which is incorporated herein by reference.

TECHNICAL FIELD

The presently disclosed subject matter relates to a voltage detection unit configured such that a voltage detection terminal to be conductively connected to a detection target is accommodated in a plate shaped housing.

BACKGROUND

In related art, there has been proposed a stacked power storage device in which a plurality of power storage modules are connected in series via conductive plates by alternately arranging and repeatedly stacking the thin plate-shaped power storage modules each capable of charging and discharging and the conductive plates. The power storage module used in this type of power storage device generally has a structure in which a plurality of battery cells are built therein, and functions as one battery that is capable of charging and discharging. In one of the power storage devices in the related art, in order to monitor an output state of each power storage module (that is, a potential of an output surface of each power storage module with respect to a reference zero potential, hereinafter, also simply referred to as a "voltage of the power storage module"), a detection terminal such as a bus bar is connected to a conductive plate in contact with the output surface of each power storage module, and a voltage of each power storage module is measured via the detection terminal (for example, see JP2020-161340A).

When the bus bar or the like is actually connected to the conductive plate in the power storage device having the above-described structure, it is difficult to secure a space for providing other components for connection (for example, bolts for bolt fastening) since the power storage module or the conductive plate has the thin plate shape. Therefore, in the power storage device described above in the related art, an insertion hole through which the detection terminal is inserted is provided in a side edge portion of the conductive plate, and the detection terminal is inserted into the insertion hole of each conductive plate from a side of a stacked body in which the power storage module and the conductive plate are stacked, thereby connecting the conductive plate and the detection terminal. However, in the connection method in the related art, when the detection terminal is inserted, since position alignment between the insertion hole of the conductive plate and the detection terminal is complicated, it is difficult to improve workability of the connection operation.

Illustrative aspects of the presently disclosed subject matter provide provides a voltage detection unit excellent in workability of conductive connection with a detection target.

SUMMARY

According to an illustrative aspect of the presently disclosed subject matter, a voltage detection unit includes a voltage detection terminal configured to be conductively connected to a detection target, a housing having a plate shape and including a terminal accommodating concave configured to accommodate the voltage detection terminal and a cover configured to be attached to the housing and to cover the voltage detection terminal accommodated in the terminal accommodating concave. The cover includes an extension piece extending in a first direction in which the cover is attached to the housing. The housing includes an accommodating hole configured to start accommodating the extension piece as the cover moves in the first direction for the cover to be attached to the housing, and a guide portion including an inclined surface and a guide surface. The inclined surface has a flat shape and has a first end in the first direction and a second end opposite to the first end and is inclined with respect to the first direction such that the first end is provided closer to the accommodating hole than the second end in a second direction perpendicular to the first direction and being parallel to a plane in which the housing having the plate shape extends. The guide surface is continuous with the inclined surface and an inner wall surface of the accommodating hole.

Other aspects and advantages of the presently disclosed subject matter will be apparent from the following description, the drawings and the claims.

DESCRIPTION OF EMBODIMENTS

Figure 1:
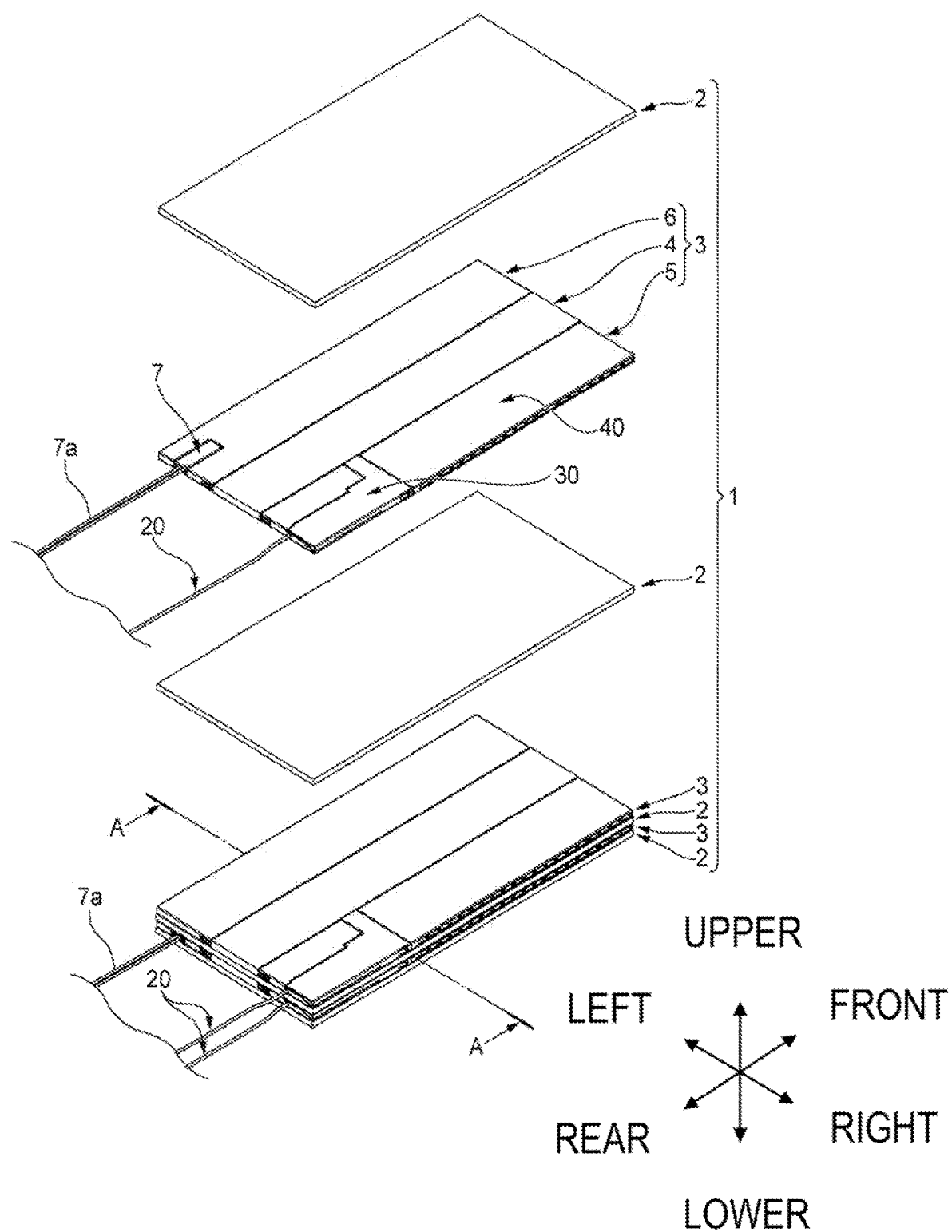
FIG. 1 is a partially exploded perspective view of a stacked power storage device including a voltage detection unit according to an embodiment of the presently disclosed subject matter.

Hereinafter, a voltage detection unit 5 according to an embodiment of the presently disclosed subject matter will be described with reference to the drawings. Hereinafter, for convenience of description, a "front-rear direction", a "left-right direction", an "upper-lower direction", a "front", a "rear", a "left", a "right", an "upper", and a "lower" are defined as shown in FIG. 1 and the like. The "front-rear direction", the "left-right direction", and the "upper-lower direction" are perpendicular to one another. The left-right direction coincides with a first direction in which a cover is attached to a housing. The front-rear direction coincides with a second direction which is perpendicular to the first direction and being parallel to a plane in which the housing having a plate shape extends.

A voltage detection unit 5 is typically used in a stacked power storage device 1, such as the one shown in FIG. 1. The power storage device 1 is formed by alternately stacking, in the upper-lower direction, rectangular thin plate-shaped power storage modules 2 that are capable of charging and discharging, and rectangular thin plate-shaped conductive modules 3 that can electrically connect adjacent power storage modules 2 to each other. In the power storage device 1, a plurality of power storage modules 2 are electrically connected to each other in series via the conductive modules 3. The power storage module 2 has a structure in which a plurality of battery cells (not shown) are built in, and the power storage module 2 as a whole functions as one battery that is capable of charging and discharging.

Figure 2A:
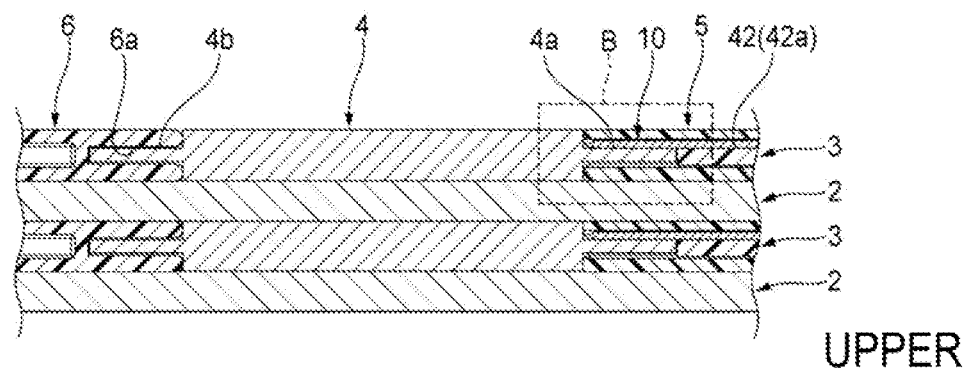
FIG. 2A is a cross-sectional view taken along a line A-A of FIG. 1.
Figure 2B:
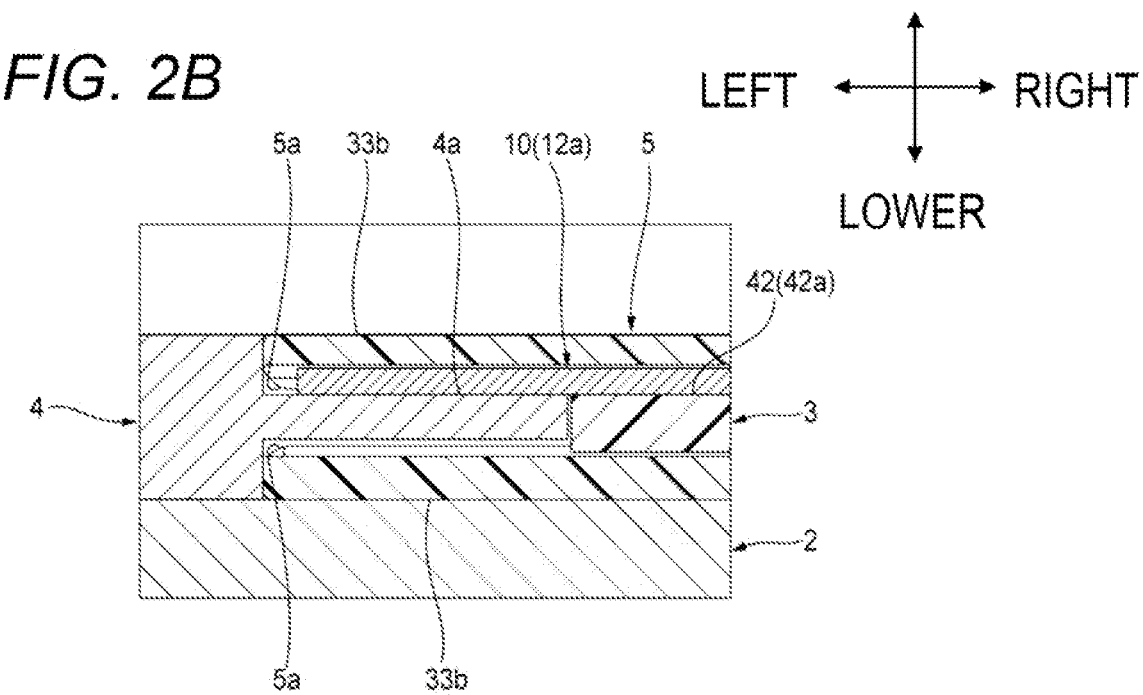
FIG. 2B is an enlarged view of a portion B of FIG. 2A.
Figure 3:
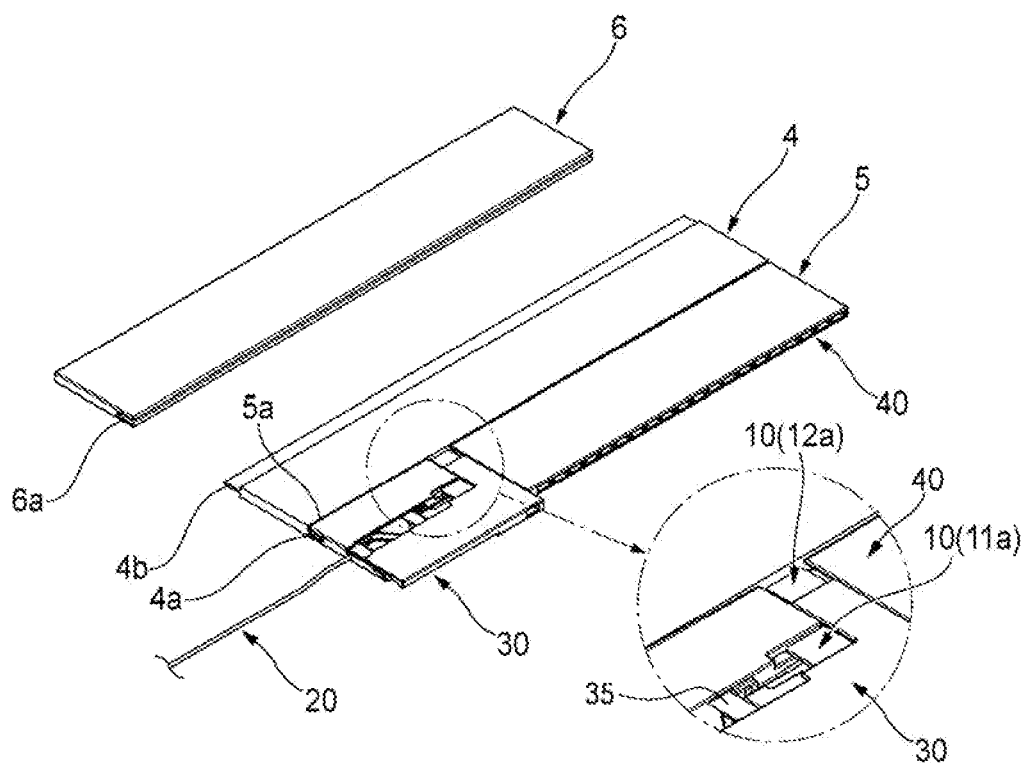
FIG. 3 is a partially exploded perspective view of a conductive module shown in FIG. 1.

As shown in FIG. 1, the conductive module 3 includes a conductive plate 4 having a rectangular thin plate shape (the conductive plate 4 also has a function as a heat sink as described later), a voltage detection unit 5 having a rectangular thin plate shape connected to a right side of the conductive plate 4, and an opposite unit 6 having a rectangular thin plate shape connected to a left side of the conductive plate 4, and is formed to have a rectangular thin plate-shape as a whole. As shown in FIGS. 1 to 3 (particularly, see FIG. 2A), the conductive plate 4 and the voltage detection unit 5 are connected to each other by fitting a flange portion 4a provided on a right end surface of the conductive plate 4 and extending in the front-rear direction into a concave portion 5a provided on a left end surface of the voltage detection unit 5 and extending in the front-rear direction. The conductive plate 4 and the opposite unit 6 are connected to each other by fitting a flange portion 4b provided on a left end surface of the conductive plate 4 and extending in the front-rear direction into a concave portion 6a provided on a right end surface of the opposite unit 6 and extending in the front-rear direction.

In each of the conductive modules 3 located between the adjacent power storage modules 2 in the upper-lower direction, the conductive plate 4 is in direct contact with the upper and lower power storage modules 2 as shown in FIG. 2A. Therefore, the conductive plate 4 has a function of electrically connecting a lower surface of the upper power storage module 2 and an upper surface of the lower power storage module 2 to each other, and a function, as a heat sink, of releasing heat generated from the upper and lower power storage modules 2 to the outside.

In each of the conductive modules 3 located between the adjacent power storage modules 2 in the upper-lower direction, the voltage detection unit 5 includes a voltage detection terminal 10 (see FIGS. 2A and 2B and the like), which will be described later, to be in contact with the conductive plate 4. The voltage detection unit 5 has a function of outputting a signal indicating a voltage between the upper and lower power storage modules 2 (specifically, a potential of the upper surface (output surface) of the lower power storage module 2 with respect to a reference zero potential) via an electric wire 20 (see FIG. 1 and the like) connected to the voltage detection terminal 10. Although the voltage detection unit 5 is disposed on a right side of the conductive plate 4 in FIGS. 1 to 3, a voltage detection unit having the same function as the voltage detection unit 5 may be disposed on a left side of the conductive plate 4. In this case, as the voltage detection unit having the same function as the voltage detection unit 5, a voltage detection unit (that is, a symmetric product of the voltage detection unit 5) obtained by reversing the entire structure of the voltage detection unit 5 in the left-right direction is used.

In each of the conductive modules 3 located between the adjacent power storage modules 2 in the upper-lower direction, as the opposite unit 6, any one of a voltage detection unit, a dummy unit, and a temperature detection unit is used in accordance with the specification of the power storage device 1.

When the opposite unit 6 is a voltage detection unit, the voltage detection unit (that is, the symmetric product of the voltage detection unit 5 described above) obtained by reversing the entire structure of the voltage detection unit 5 in the left-right direction is used as the opposite unit 6. In this case, the voltage detection unit 5 is disposed on the right side of the conductive plate 4, and the symmetric product of the voltage detection unit 5 is disposed on the left side of the conductive plate 4. The opposite unit 6 (the symmetric product of the voltage detection unit 5) has the same function as the voltage detection unit 5.

When the opposite unit 6 is a dummy unit, as shown in FIG. 3, a simple resin plate having the concave portion 6a extending in the front-rear direction is used as the opposite unit 6. In this case, the opposite unit 6 only has a function of filling a gap between the upper and lower power storage modules 2.

When the opposite unit 6 is a temperature detection unit, as shown in FIG. 1, the opposite unit 6 has a structure in which a temperature sensor 7 (thermistor) is incorporated in the resin plate used as the dummy unit. In this case, the opposite unit 6 has a function of outputting a signal indicating temperatures of the upper and lower power storage modules 2 via an electric wire 7a (see FIG. 1) connected to the temperature sensor 7.

Figure 4:
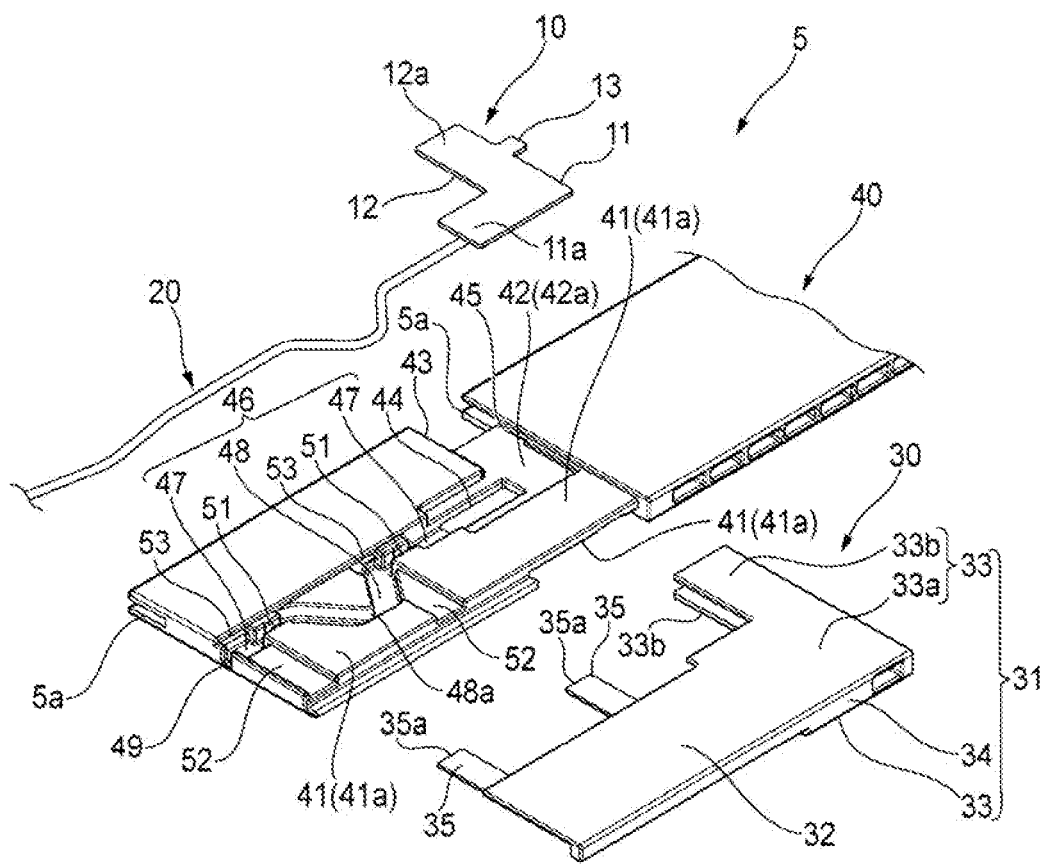
FIG. 4 is an exploded perspective view of the voltage detection unit according to the embodiment of the presently disclosed subject matter shown in FIG. 1.
Figure 5A:
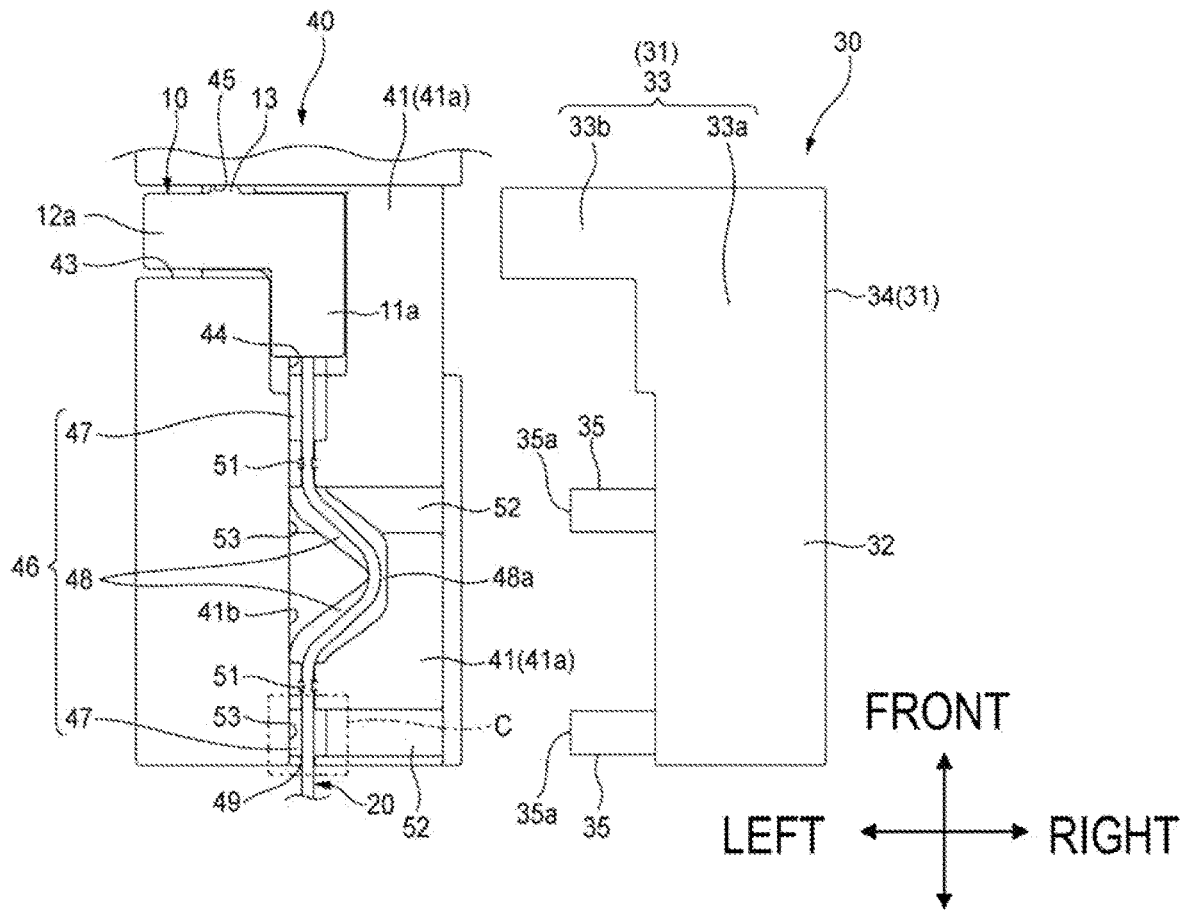
FIG. 5A is a top view showing a housing in which a voltage detection terminal and an electric wire are accommodated and a cover.
Figures 5B, 5C:
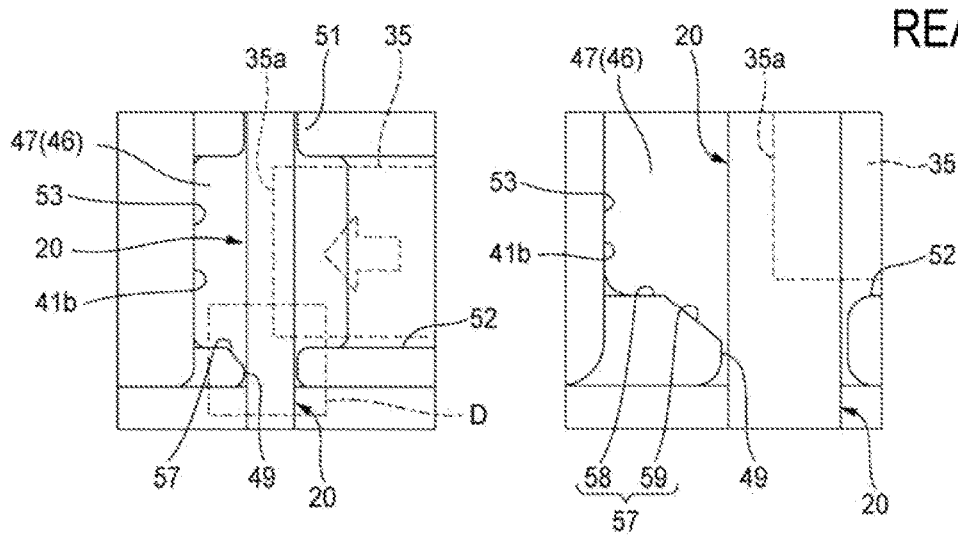
FIG. 5B is an enlarged view of a portion C in FIG. 5A.
FIG. 5C is an enlarged view of a portion D in FIG. 5B.

Hereinafter, a specific configuration of the voltage detection unit 5 according to the embodiment of the presently disclosed subject matter will be described with reference to FIGS. 4 to 8B. As shown in FIG. 4, the voltage detection unit 5 includes a housing 40, the voltage detection terminal 10 accommodated in the housing 40, the electric wire 20 connected to the voltage detection terminal 10 and accommodated in the housing 40, and a cover 30 attached to the housing 40.

The voltage detection terminal 10 is accommodated in a terminal accommodating concave 42 (see FIG. 4), which will be described later, formed in the housing 40, the electric wire 20 is accommodated in an electric wire accommodating concave 46 (see FIG. 4), which will be described later, formed in the housing 40, and the cover 30 is attached to cover attaching concaves 41 (see FIG. 4), which will be described later, formed in the housing 40. Hereinafter, each member forming the voltage detection unit 5 will be described in order.

First, the voltage detection terminal 10 will be described. The voltage detection terminal 10 made of metal is formed by performing processing such as press processing on one metal plate. The voltage detection terminal 10 is accommodated in the terminal accommodating concave 42 of the housing 40 from above. As shown in FIG. 4, the voltage detection terminal 10 includes a first portion 11 having a rectangular flat plate shape extending in the front-rear direction and a second portion 12 having a rectangular flat plate shape extending leftward from a front-end portion of the first portion 11, and has a flat plate shape which is a substantially L-shape as a whole when viewed in the upper-lower direction.

Figure 6:
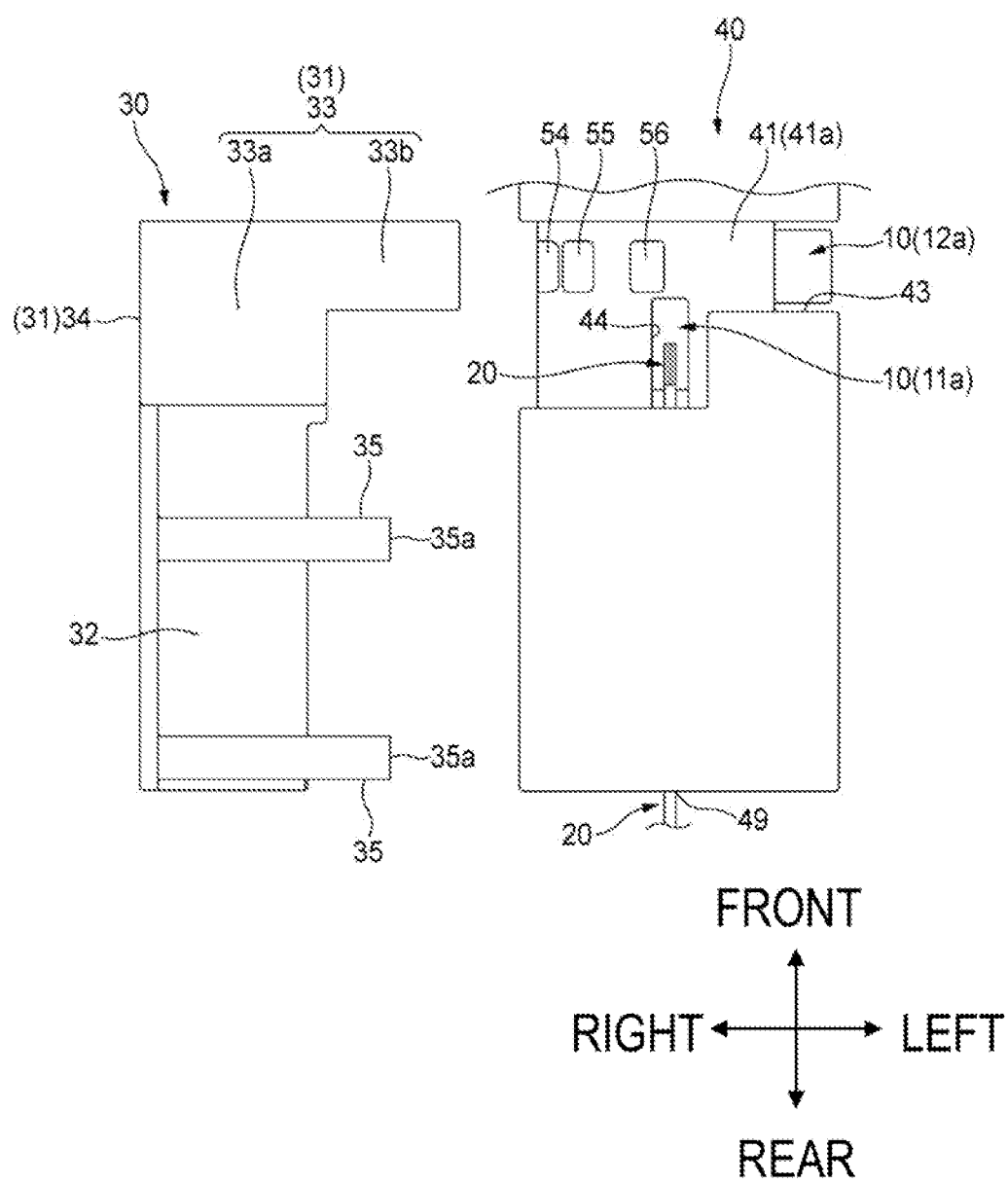
FIG. 6 is a bottom view showing the housing in which the voltage detection terminal and the electric wire are accommodated and the cover.

One end portion of the electric wire 20 is fixed to a lower surface of a distal end portion 11a (that is, an end portion on a rear end side) of the first portion 11 so as to be electrically connected thereto (see also FIG. 6). The other end portion of the electric wire 20 is connected to a voltage measuring device (not shown) outside the power storage device 1. A part of the flange portion 4a of the conductive plate 4 is to be fixed to a lower surface of a distal end portion 12a (that is, an end portion on a left end side) of the second portion 12 by a technique such as ultrasonic bonding or welding (see FIG. 2B).

A protruding portion 13 protruding forward is formed at a front-end edge of the second portion 12. When the voltage detection terminal 10 is accommodated in the housing 40, the protruding portion 13 is locked to a locking groove 45 (see FIG. 4) formed in the housing 40.

Next, the cover 30 will be described. The cover 30 is a resin molded product, and is attached to the cover attaching concaves 41 of the housing 40 from the right side. The cover 30 includes an opposing portion 31 and an extending portion 32 extending rearward from the opposing portion 31. The opposing portion 31 mainly functions to cover and protect the voltage detection terminal 10, and the extending portion 32 mainly functions to cover and protect the electric wire 20.

The opposing portion 31 includes a pair of flat plate portions 33 having the same shape and facing each other at an interval in the upper-lower direction, and a connecting portion 34 that connects, in the upper-lower direction, right end edges of the pair of flat plate portions 33 extending in the front-rear direction to each other over the entire area of the right end edges in the front-rear direction. The opposing portion 31 has a substantially U-shape opening leftward when viewed in the front-rear direction. The flat plate portions 33 each includes a substantially square flat plate-shaped base portion 33a connected to the connecting portion 34 and a rectangular flat plate shaped extending portion 33b extending leftward from a front-end portion of the base portion 33a, and has a substantially L shape as a whole when viewed in the upper-lower direction. The extending portion 32 extends rearward continuously from and is flush with a rear end edge of the upper flat plate portion 33 (more specifically, the upper base portion 33a) of the pair of flat plate portions 33 forming the opposing portion 31, and has a substantially rectangular flat plate shape.

In the extending portion 32, a pair of electric wire holding pieces 35 extending in the left-right direction are integrally formed so as to be arranged at an interval in the front-rear direction. As can be understood from FIG. 6, each electric wire holding piece 35 protrudes downward from a lower surface of the extending portion 32, extends in the left-right direction, and timber extends leftward from a left end edge of the extending portion 32. Extended end portion 35a of each electric wire holding piece 35 has a rectangular shape (in other words, an oblong shape) when viewed in the upper-lower direction. When the cover 30 is attached to the housing 40, the electric wire holding pieces 35 function to hold the electric wire 20 accommodated in the housing 40. The "rectangular shape" refers to a tetragonal shape in which corners of the extended end portion 35a are not intentionally chamfered except for rounded corners or the like of the extended end portion 35a that may be inevitably formed when the electric wire holding piece 35 is molded. In other words, the electric wire holding piece 35 does not have a tapered shape.

Figure 7A:
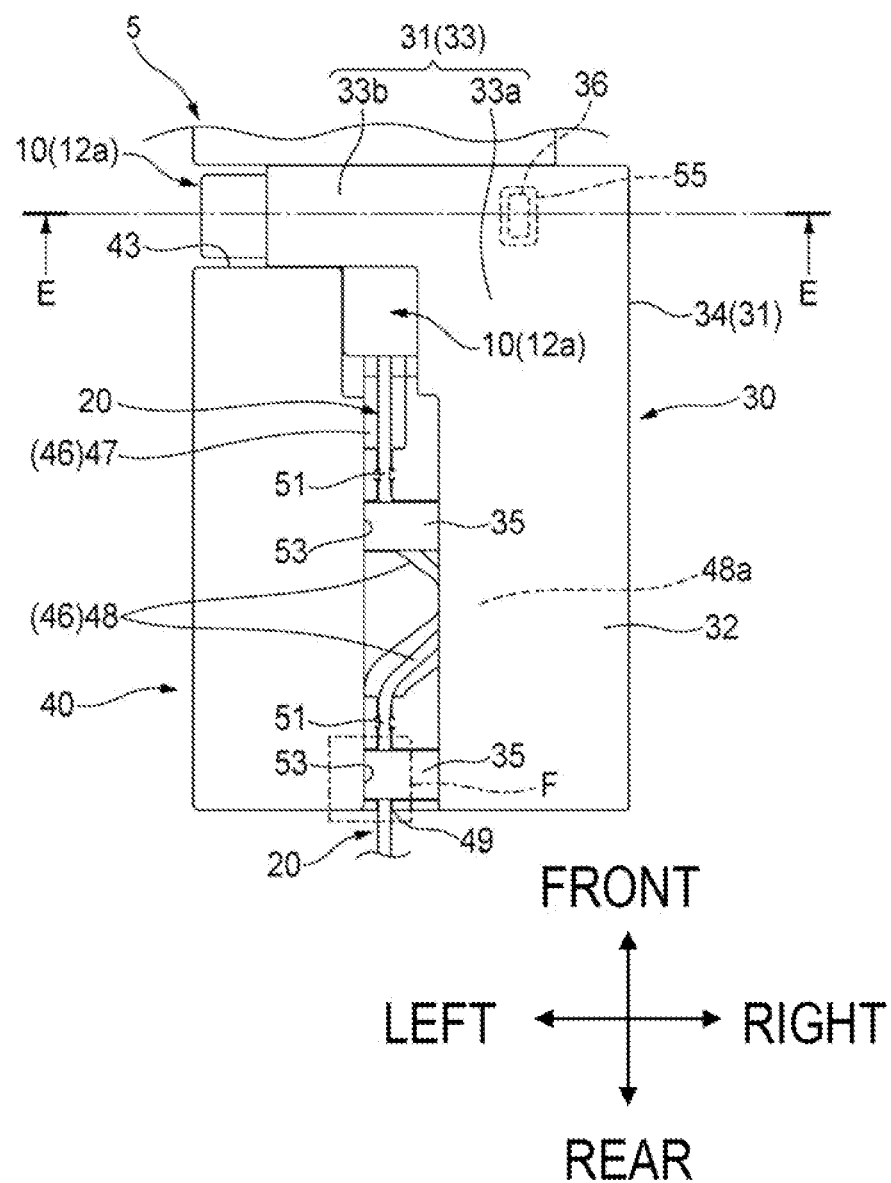
FIG. 7A is a top view showing a state in which the cover is locked to the housing at a temporary locking position.
Figure 7B:
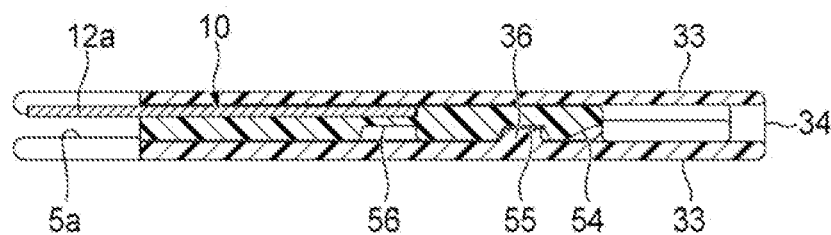
FIG. 7B is a cross-sectional view taken along a line E-E of FIG. 7A.
Figure 7C:
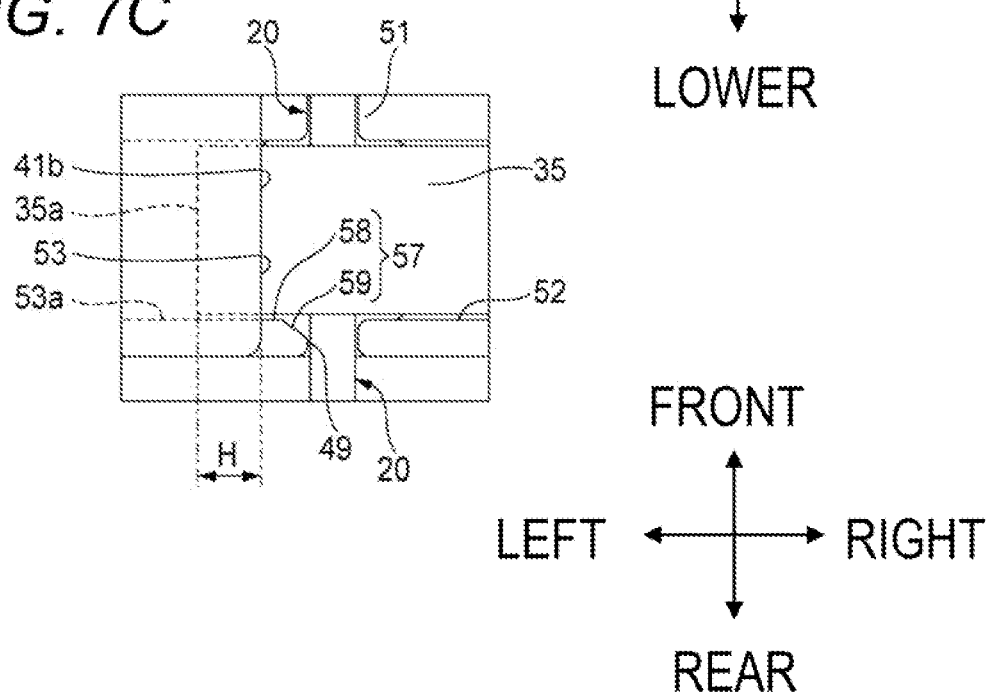
FIG. 7C is an enlarged view of a portion F in FIG. 7A.
Figure 8A:
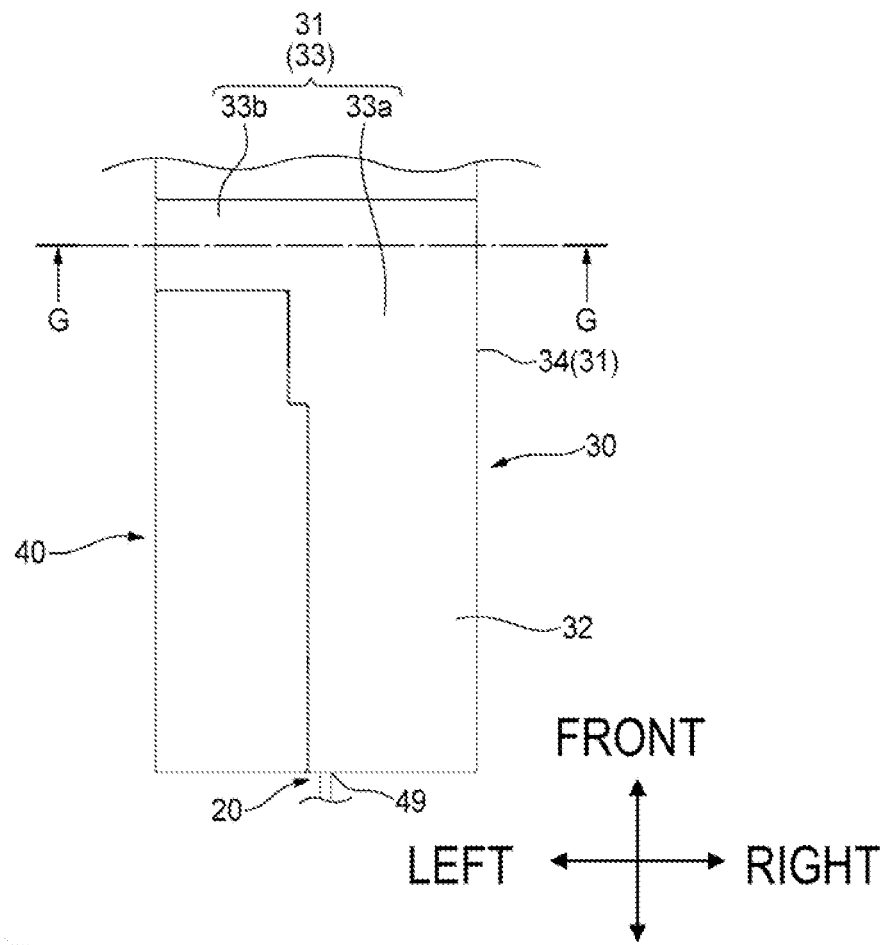
FIG. 8A is a top view showing a state in which the cover is locked to the housing at a final lock position.
Figure 8B:
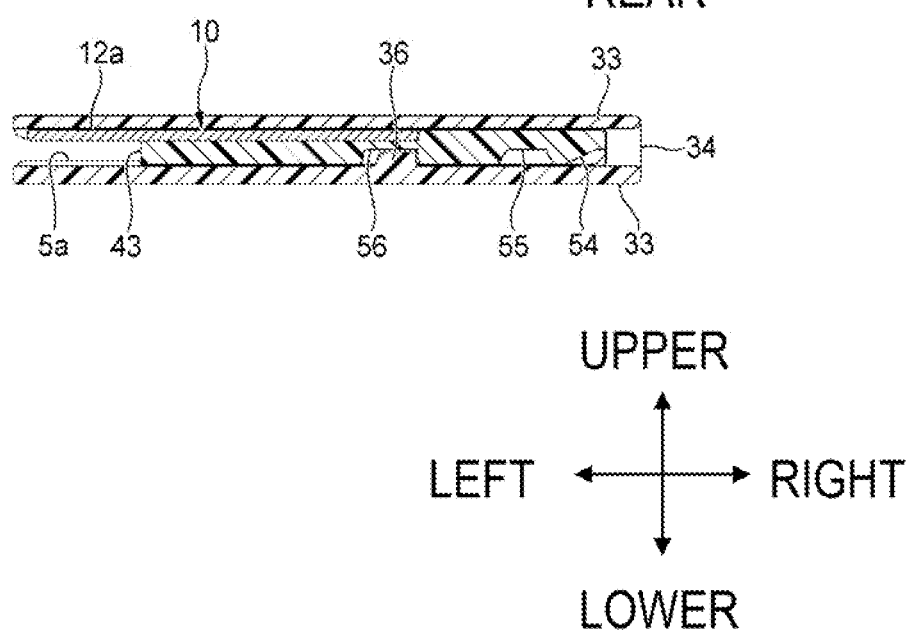
FIG. 8B is a cross-sectional view taken along a line G-G of FIG. 8A.

A locking portion 36 protruding upward toward the upper flat plate portion 33 is formed at a predetermined position of the lower flat plate portion 33 (more specifically, the lower base portion 33a) of the pair of flat plate portions 33 forming the opposing portion 31 (see FIGS. 7B and 8B). The locking portion 36 functions to lock the cover 30 to a temporary locking position (see FIGS. 7A to 7C) and a final locking position (see FIGS. 8A and 8B) in cooperation with a temporary locked portion 55 and a final locked portion 56, which will be described later, provided in the housing 40.

Next, the housing 40 will be described. The housing 40 is a resin molded product, and has a substantially rectangular thin plate shape extending in the front-rear direction, as shown in FIGS. 1, 3, and the like. The concave portion 5a that is concave rightward and extends in the front-rear direction is formed in a left end surface of the housing 40. The flange portion 4a of the conductive plate 4 is to be fitted into the concave portion 5a (see FIGS. 2A, 2B and the like).

The cover attaching concaves 41 each having a shape corresponding to the entire shape of the cover 30 and being concave are formed in portions, to which the cover 30 is to be attached, of upper and lower surfaces of the housing 40 (see FIG. 4). A concave depth (depth in the upper-lower direction) of the cover attaching concave 41 is equal to a plate thickness of the cover 30 (the opposing portion 31+the extending portion 32). Therefore, when the cover 30 is attached to the housing 40, the surfaces of the housing 40 and surfaces of the cover 30 are flush with each other (see FIGS. 1 and 8A and 8B).

The terminal accommodating concave 42 having a shape corresponding to the entire shape of the voltage detection terminal 10 and being further concave from a bottom surface 41a of the cover attaching concave 41 is formed in a portion, in which the voltage detection terminal 10 is to be accommodated, of the bottom surface 41a of the cover attaching concave 41 on an upper surface side of the housing 40 (see FIG. 4). A concave depth (depth in the upper-lower direction) of the terminal accommodating concave 42 is equal to a plate thickness of the voltage detection terminal 10. Therefore, when the voltage detection terminal 10 is attached to the housing 40, an upper surface of the voltage detection terminal 10 and the bottom surface 41a of the cover attaching concave 41 are flush with each other (see FIGS. 7B and 8B).

A notch 43 being concave rightward in a substantially rectangular shape when viewed in the upper-lower direction is formed at a position at a left end edge of the housing 40 in the front-rear direction where the distal end portion 12a of the voltage detection terminal 10 is to be disposed. The concave portion 5a extending in the front-rear direction on the left end surface of the housing 40 is divided via the notch 43. When the voltage detection terminal 10 is accommodated in the housing 40, upper and lower surfaces of the distal end portion 12a of the voltage detection terminal 10 are exposed via the notch 43 (see FIG. 7B).

A through hole 44 extending in the front-rear direction and penetrating in the upper-lower direction is formed in a portion of the terminal accommodating concave 42 where the distal end portion 11a of the voltage detection terminal 10 is to be disposed. When the voltage detection terminal 10 is accommodated in the housing 40, the one end portion (contact point) of the electric wire 20 connected to the voltage detection terminal 10 enters the through hole 44 (see FIG. 6). In other words, the through hole 44 functions as a relief portion for avoiding interference between a bottom surface 42a of the terminal accommodating concave 42 and the one end portion of the electric wire 20.

The locking groove 45 that is concave forward and communicates with the concave portion 5a to correspond to the protruding portion 13 is formed on an inner wall surface of the terminal accommodating concave 42 at a position where the protruding portion 13 (see FIG. 4) of the voltage detection terminal 10 is to be disposed (see FIG. 4).

The electric wire accommodating concave 46 being concave and having a shape corresponding to a routing form of the electric wire 20 when the electric wire 20 is accommodated is formed in a portion of an upper surface of the housing 40 where the electric wire 20 is to be accommodated (see FIG. 4). The electric wire accommodating concave 46 is a series of groove portions including a pair of straight portions 47 that extend in a straight line-shape extending in the front-rear direction and arranged at an interval in the front-rear direction, and a bent portion 48 connecting the pair of straight portions 47 and extending while being bent so as to protrude rightward. A front end of the front straight portion 47 of the pair of straight portions 47 communicates with the terminal accommodating concave 42, and a rear end of the rear straight portion 47 of the pair of straight portions 47 forms an electric wire draw-out opening 49 through which the electric wire 20 extends from a rear end edge of the housing 40. In this manner, since the electric wire accommodating concave 46 includes the bent portion 48, even when an unintended external force is applied to the electric wire 20 drawn out from the housing 40, the external force can be counteracted by friction between the bent portion 48 and the electric wire 20, as compared with a case where the electric wire accommodating concave 46 is formed only of the straight portions 47. Therefore, a large external force is unlikely to be applied to the contact point between the voltage detection terminal 10 and the electric wire 20.

Narrow-width concave portions 51, which are concave portion each having a width (interval in the left-right direction) narrower than that of the straight portion 47, are respectively provided at portions near boundaries between the pair of straight portions 47 and the bent portion 48. The width of the narrow-width concave portion 51 is slightly smaller than an outer diameter of the electric wire 20. Therefore, the narrow-width concave portions 51 function to hold the electric wire 20 while pressing the electric wire 20 in the left-right direction. Since the electric wire 20 is held by the pair of narrow-width concave portions 51, even when an unintended external force is applied to the electric wire 20 drawn out from the housing 40, the external force can be counteracted by friction between the narrow-width concave portions 51 and the electric wire 20. Therefore, a large external force is unlikely to be applied to the contact point between the voltage detection terminal 10 and the electric wire 20. Further, it is possible to prevent the electric wire 20 from coming out of the bent portion 48 in a more secure manner and being routed so as to skip the bent portion 48 (that is, to shortcut the bent portion 48).

As shown in FIG. 4, a pair of electric wire holding piece concave portions 52 that extend in the left-right direction and correspond to the pair of electric wire holding pieces 35 are formed in the bottom surface 41a of the cover attaching concave 41 on the upper surface side of the housing 40 at positions where the pair of electric wire holding pieces 35 of the cover 30 are to be disposed, so that the pair of electric wire holding piece concave portions 52 are arranged at an interval in the front-rear direction. The pair of electric wire holding piece concave portions 52 are arranged such that an apex 48a (see FIG. 4) of the bent portion 48 of the electric wire accommodating concave 46 is disposed between the pair of electric wire holding piece concave portions 52 in the front-rear direction. Bottom surfaces of the pair of electric wire holding piece concave portions 52 are located above a bottom surface of the electric wire accommodating concave 46.

Each electric wire holding piece concave portion 52 extends in the left-right direction from a right end edge of the upper surface of the housing 40 on the upper surface of the housing 40 to a left end inner wall 41b (see FIG. 4) of the cover attaching concave 41 across the electric wire accommodating concave 46. Accommodating holes 53 being concave leftward are respectively formed in portions, to which the pair of electric wire holding piece concave portions 52 are connected, of the left end inner wall 41b of the cover attaching concave 41 (see FIG. 4). When the cover 30 is attached to the housing 40, extended end portions (that is, left end portions) of the pair of electric wire holding pieces 35 of the cover 30 are inserted into and stored in the pair of accommodating holes 53.

As shown in FIG. 6, on the bottom surface 41a of the cover attaching concave 41 on a lower surface side of the housing 40, a contact portion 54, the temporary locked portion 55, and the final locked portion 56, which are concave portions being concave upward, are formed in this order so as to be arranged at intervals from right to left at a position in the front-rear direction same as the position where the locking portion 36 (see FIG. 7B and the like) of the cover 30 is disposed. As shown in FIGS. 6 to 8B (particularly, see FIG. 6), the contact portion 54 is a concave portion that is continuous from a right end edge of the housing 40.

As shown in FIGS. 4, 5A to 5C, the rear electric wire holding piece concave portion 52 of the pair of front and rear electric wire holding piece concave portions 52 extends in the left-right direction near the rear end edge of the housing 40 extending in the left-right direction. A rear groove inner wall that defines the rear electric wire holding piece concave portion 52 and extends in the left-right direction is divided by the electric wire draw-out opening 49 (see FIG. 5B). Hereinafter, a portion, which is located between the electric wire draw-out opening 49 and a left end inner wall 41b of the cover attaching concave 41, of the rear groove inner wall that defines the rear electric wire holding piece concave portion 52 and extends in the left-right direction is particularly referred to as a "guide portion 57" (see FIGS. 5B, 5C, and 7C).

The guide portion 57 includes a flat guide surface 58 that is continuous with a rear inner wall surface 53a (see FIG. 7C), which extends in the left-right direction, of the rear accommodating hole 53 of the pair of front and rear accommodating holes 53 and extends rightward from the rear inner wall surface 53a along the left-right direction, and a flat inclined surface 59 that is continuous with the guide surface 58, is inclined with respect to the left-right direction, and extends rightward from the guide surface 58 up to a point where an inner wall surface of the electric wire draw-out opening 49 is provided. The inclined surface 59 is inclined with respect to the left-right direction such that the inclined surface 59 is inclined rearward toward the right side. In other words, the inclined surface 59 is inclined with respect to an attachment direction in which the cover 30 is attached to the housing 40 such that the inclined surface 59 approaches the accommodating hole 53 as the inclined surface 59 extends from the rear side toward the front side in the attachment direction of the cover 30 to the housing 40. An effect achieved by providing the guide portion 57 (guide surface 58+inclined surface 59) will be described later. The members forming the voltage detection unit 5 are described above.

Next, a procedure when the voltage detection terminal 10 and the cover 30 are attached to the housing 40 will be described. First, the voltage detection terminal 10 to which the electric wire 20 is connected in advance by a technique such as the ultrasonic bonding or the welding is accommodated in the terminal accommodating concave 42 of the housing 40. Therefore, the voltage detection terminal 10 is fitted into the terminal accommodating concave 42 of the housing 40 from above such that the protruding portion 13 enters the locking groove 45 and the one end portion (contact point) of the electric wire 20 enters the through hole 44. In a state where the accommodation of the voltage detection terminal 10 in the housing 40 is completed, the upper and lower surfaces of the distal end portion 12a of the voltage detection terminal 10 are exposed is the notch 43 (see FIG. 7B).

Next, the electric wire 20 extending from the voltage detection terminal 10 accommodated in the housing 40 is accommodated in the electric wire accommodating concave 46 of the housing 40. Therefore, the electric wire 20 is fitted from above along the electric wire accommodating concave 46 formed by the pair of straight portions 47 and the bent portion 48. At this time, a pair of portions of the electric wire 20 positioned above the pair of narrow-width concave portions 51 are pushed downward, whereby the pair of portions of the electric wire 20 are accommodated in the pair of narrow-width concave portions 51. In a state where the accommodation of the electric wire 20 in the housing 40 is completed, the electric wire 20 extends rearward from the electric wire draw-out opening 49 to the outside of the housing 40.

Next, the cover 30 is attached to the housing 40. Therefore, the cover 30 is attached to the cover attaching concaves 41 of the housing 40 from the right side such that the opposing portion 31 of the cover 30 vertically sandwiches the cover attaching concaves 41 on the upper and lower surfaces of the housing 40, the extending portion 32 of the cover 30 covers the cover attaching concaves 41 on the upper surplice side of the housing 40, and the pair of electric wire holding pieces 35 of the cover 30 covers the pair of electric wire holding piece concave portions 52 of the housing 40.

When the cover 30 is attached to the cover attaching concaves 41 of the housing 40, even if the pair of front and rear electric wire holding pieces 35 of the cover 30 are offset to the rear side with respect to the pair of front and rear accommodating holes 53 of the housing 40 (that is, even when axial deviation to the rear side occurs), the inclined surface 59 of the guide portion 57 of the housing 40 contacts the extended end portion 35a of the rear electric wire holding piece 35, so that the extended end portion 35a is guided by being pushed toward the front side, thereby reducing the axial deviation. Further, the rear electric wire holding piece 35 is guided to the rear accommodating hole 53 by the guide surface 58 of the guide portion 57. As a result, the front electric wire holding piece 35 is also guided to the front accommodating hole 53. Therefore, workability of an operation of attaching the cover 30 to the housing 40 is improved.

In the process of attaching the cover 30 to the housing 40, the locking portion 36 of the cover 30 first comes into contact with a side surface of the contact portion 54 of the housing 40, goes over the contact portion 54 while sliding on the side surface, and then enters the inside of the temporary locked portion 55, so that the locking portion 36 engages with the temporary locked portion 55, and is pressed against a side surface of the temporary locked portion 55 on a left side (see FIG. 7B). As a result, the cover 30 is locked to the housing 40 at the temporary locking position, the attachment of the cover 30 to the housing 40 is completed (see FIGS. 7A to 7C), and the voltage detection unit 5 (see FIG. 3) is obtained. As will be described later, the voltage detection unit 5 obtained after the attachment of the cover 30 to the housing 40 is completed (in the state where the cover 30 is locked at the temporary locking position) is used for assembling the conductive module 3 (see FIG. 1).

In the state where the cover 30 is locked at the temporary locking position, as shown in FIG. 7A, the opposing portion 31 (more specifically, the pan of upper and lower extending portions 33b) of the cover 30 does not cover the distal end portion 12a of the voltage detection terminal 10. Therefore, the upper and lower surfaces of the distal end portion 12a of the voltage detection terminal 10 are still exposed via the notch 43 (see FIG. 7B).

Further, the pair of electric wire holding pieces 35 of the cover 30 are disposed on a part of openings of the straight portion 47 and the bent portion 48 of the electric wire accommodating concave 46. As a result, the electric wire 20 is prevented from coming out of the electric wire accommodating concave 46.

Further, the extended end portions 35a of the pair of electric wire holding pieces 35 are inserted in the pair of accommodating holes 53, and the extended end portions 35a of the electric wire holding pieces 35 enter the accommodating holes 53 by a dimension H (>0) in the left-right direction (see FIG. 7C). Accordingly, it is possible to prevent positional deviation of the pair of electric wire holding pieces 35 and unintended deformation such as separation of the pair of electric wire holding pieces 35 from the electric wire accommodating concave 46. Further, the guide portion 57 is disposed at a position where the electric wire holding pieces 35 are disposed between the guide portion 57 and the temporary locked portion 55 (see FIG. 7A), and the extended end portion 35a of the rear electric wire holding piece 35 is in contact with the inner wall surface 53a of the accommodating hole 53 and the guide portion 57 (guide surface 58) (see FIG. 7C), and therefore, the cover 30 is prevented from being displaced in a direction in which the cover 30 rotates with respect to the housing 40 around the locking portion 36 (that is, rotational deviation). As a result, it is possible to reduce a possibility that such rotational deviation causes a problem that the electric wire holding pieces 35 come out of the accommodating holes 53.

Further, the extended end portions 35a of the electric wire holding pieces 35 of the cover 30 each has a non-chamfered rectangular shape. Accordingly, a contact area (so-called engagement margin) at which the inner wall surface 53a of the accommodating hole 53 and the electric wire holding piece 35 contact each other can be increased as compared with a case where the extended end portions 35a of the electric wire holding pieces 35 each has a chamfered (that is, tapered) shape. As a result, it is possible to further reduce the possibility that the above-described rotational deviation causes the problem that the electric wire holding pieces 35 come out of the accommodating holes 53.

Further, the extending portion 32 of the cover 30 is disposed on an opening of the apex 48a of the bent portion 48 of the electric wire accommodating concave 46. Accordingly, it is possible to prevent the electric wire 20 from coming out of the electric wire accommodating concave 46 in a more secure manner and being routed so as to skip the bent portion 48 (that is, to shortcut the bent portion 48). In this manner, it is possible to reduce a possibility that a specific problem occurs due to the electric wire 20 coming out of the bent portion 48 of the electric wire accommodating concave 46.

When the cover 30 is further pushed leftward with respect to the housing 40 in the state where the cover 30 is locked at the temporary locking position, the extended end portions of the pair of electric wire holding pieces 35 of the cover 30 further enter and are stored in the pair of accommodating holes 53, and the locking portion 36 of the cover 30 goes over the temporary locked portion 55, and then enters the inside of the final locked portion 56 to be engaged with the final locked portion 56 (see FIGS. 8A and 8B). As a result, the cover 30 is locked to the housing 40 at the final locking position.

In the state where the cover 30 is locked at the final locking position, as shown in FIGS. 8A and 8B, an entire region of the cover attaching concave 41 is covered by the cover 30, so that the entire electric wire accommodating concave 46 is covered by the extending portion 32 of the cover 30. As a result, the electric wire 20 is prevented from coming out of the electric wire accommodating concave 46. Further, as shown in FIG. 8A, the opposing portion 31 (more specifically, the pair of upper and lower extending portions 33b) of the cover 30 covers the upper and lower surfaces of the distal end portion 12a of the voltage detection terminal 10. As a result, the entire voltage detection terminal 10 is covered by the opposing portion 31 of the cover 30, and thus, the voltage detection terminal 10 can be reliably protected.

As described above, the voltage detection unit 5 obtained after the attachment of the cover 30 to the housing 40 is completed (in the state where the cover 30 is locked at the temporary locking position) is used for assembling the conductive module 3 (see FIG. 1). Specifically, first, as shown in FIG. 3, the flange portion 4a of the conductive plate 4 and the concave portion 5a of the voltage detection unit 5 are fitted to each other, so that the voltage detection unit 5 is connected to the right side of the conductive plate 4.

In this state, as can be understood from FIGS. 3 and 7B, a part of the flange portion 4a of the conductive plate 4 is disposed so as to overlap a lower side of the distal end portion 12a of the voltage detection terminal 10 (see also FIG. 2B), and since the notch 43 of the housing 40 is present, the upper surface of the distal end portion 12a of the voltage detection terminal 10 is exposed upward, and a part of a lower surface of the flange portion 4a of the conductive plate 4 is exposed downward.

Next, by using the upper surface of the distal end portion 12a of the voltage detection terminal 10 exposed upward and the part of the lower surface of the flange portion 4a of the conductive plate 4 exposed downward, the distal end portion 12a of the voltage detection terminal 10 and the part of the flange portion 4a of the conductive plate 4 are fixed to each other by a technique such as the ultrasonic bonding or the welding. Thereafter, the cover 30 is moved from the temporary locking position to the final locking position, and the assembly of the voltage detection unit 5 and the conductive plate 4 is completed.

Next, the flange portion 4b of the conductive plate 4 and the concave portion 6a of the opposite unit 6 are fitted to each other, so that the opposite unit 6 is connected to the left side of the conductive plate 4 to which the voltage detection unit 5 is attached (see FIG. 2A and the like). Thus, the assembly of the conductive module 3 is completed.

The conductive module 3 obtained in this manner is subjected to assembly of the power storage device 1 shown in FIG. 1. Specifically, the power storage device 1 is obtained by alternately stacking the power storage modules 2 and the conductive modules 3 in the upper-lower direction and fixing these stacked modules with a predetermined metal fitting or the like.

As described above, according to the voltage detection unit 5 of the present embodiment, the voltage detection terminal 10 to which the electric wire 20 is connected can be accommodated in the terminal accommodating concave 42 of the plate shaped housing 40, and the voltage detection terminal 10 can be covered by the cover 30. As a result, the voltage detection terminal 10 can be stored inside the voltage detection unit 5 while reducing a thickness of the voltage detection unit 5 (that is, forming the voltage detection unit 5 into a plate shaped outer shape). Further, when the voltage detection unit 5 is electrically connected to the conductive plate 4 to be used in the power storage device 1, for example, if a position of the cover 30 is appropriately adjusted so that the voltage detection terminal 10 is exposed after the voltage detection unit 5 is attached to the conductive plate 4, the exposed voltage detection terminal 10 and the conductive plate 4 can be fixed by using a technique such as the ultrasonic bonding or the welding. As a result, as compared with typical bolt fastening or the like, it is possible to eliminate a need for other components for connection, and as compared with the above-described connection method in the related art, it is possible to facilitate position alignment of the voltage detection terminal 10 and the conductive plate 4 and to reduce contact resistance at a contact point. Further, when the output electric wire 20 is connected to the voltage detection terminal 10 and the electric wire 20 is routed in the housing 40, the electric wire 20 can be maintained in an appropriately routed state by preventing the positional deviation or the like of the electric wire 20 by the electric wire holding pieces 35 of the cover 30. Therefore, the voltage detection unit 5 according to the present embodiment is excellent in workability of the conductive connection with a detection target (conductive plate 4).

Further, when the cover 30 is attached to the housing 40, even if the electric wire holding pieces 35 of the cover 30 and the accommodating holes 53 of the housing 40 are offset in a direction (front-rear direction) intersecting the attachment direction (that is, even if the axial deviation occurs), the axial deviation is reduced by the inclined surface 59 of the guide portions 57 of the housing 40. Further, the electric wire holding pieces 35 can be properly guided to the accommodating holes 53 by the guide surface 58 continuous with the inclined surface 59. Therefore, workability of an operation of attaching the cover 30 to the housing 40 is improved.

Further, in a state where the locking portion 36 of the cover 30 is engaged with the temporary locked portion 55 of the housing 40 (see FIG. 7A), the electric wire holding piece 35 of the cover 30 and the guide portion 57 come into contact with each other, so that the cover 30 is prevented from being displaced (that is, rotational deviation) in a direction in which the cover 30 rotates around an engagement point between the locking portion 36 of the cover 30 and the temporary locked portion 55 of the housing 40. As a result, it is possible to reduce a possibility that such rotational deviation causes a problem that the electric wire holding pieces 35 come out of the accommodating holes 53.

Further, the extended end portions 35a of the electric wire holding pieces 35 of the cover 30 each has a non-chamfered rectangular shape. Accordingly, a contact area (so-called engagement margin) at which the inner wall surface 53a of the accommodating hole 53 and the electric wire holding piece 35 contact each other can be increased as compared with a case where the extended end portions 35a of the electric wire holding pieces 35 each has a chamfered (that is, tapered) shape. As a result, it is possible to further reduce the possibility that the above-described rotational deviation causes the problem that the electric wire holding pieces 35 come out of the accommodating holes 53.

While the presently disclosed subject matter has been described with reference to certain exemplary embodiments thereof, the scope of the presently disclosed subject matter is not limited to the exemplary embodiments described above, and it will be understood by those skilled in the art that various changes and modifications may be made therein without departing from the scope of the presently disclosed subject matter as defined by the appended claims.

In the above embodiment, the cover 30 is provided with the pair of electric wire holding pieces 35. However, the cover 30 may be provided with one electric wire holding piece 35, or three or more electric wire holding pieces 35.

Further, the extended end portions 35a of the electric wire holding pieces 35 of the cover 30 each has a non-chamfered rectangular shape. However, the extended end portions 35a of the electric wire holding pieces 35 each may have a chamfered (that is, tapered) shape.

According to an aspect of the embodiments described above, a voltage detection unit (5) includes a voltage detection terminal (10) configured to be conductively connected to a detection target (4), a housing (40) having a plate shape and including a terminal accommodating concave (42) configured to accommodate the voltage detection terminal (10) and a cover (30) configured to be attached to the housing (40) and to cover the voltage detection terminal (10) accommodated in the terminal accommodating concave (42). The cover (30) includes an extension piece (35) extending in a first direction in which the cover (30) is attached to the housing (40). The housing (40) includes an accommodating hole (53) configured to start accommodating the extension piece (35) as the cover (30) moves in the first direction for the cover (30) to be attached to the housing (40), and a guide portion (57) including an inclined surface (59) and a guide surface (58). The inclined surface (59) has a flat shape and has a first end in the first direction and a second end opposite to the first end and is inclined with respect to the first direction such that the first end is provided closer to the accommodating hole (53) than the second end in a second direction perpendicular to the first direction and being parallel to a plane in which the housing (40) having the plate shape extends. The guide surface (58) is continuous with the inclined surface (59) and an inner wall surface (53a) of the accommodating hole (53).

According to the voltage detection unit having the above-described configuration, the voltage detection terminal can be accommodated in the terminal accommodating concave of the plate shaped housing, and the voltage detection terminal can be covered by the cover. As a result, the voltage detection terminal can be stored inside the voltage detection unit while reducing the thickness of the voltage detection unit (that is, forming the voltage detection unit into a plate shaped outer shape). Further, when the voltage detection unit is electrically connected to the detection target (for example, conductive plate used in the stacked power storage device), for example, if the position of the cover is appropriately adjusted so that the voltage detection terminal is exposed after the voltage detection unit is attached to the detection target, the exposed voltage detection terminal and the detection target can be fixed by using a technique such as the ultrasonic bonding or the welding. As a result, as compared with typical bolt fastening or the like, it is possible to eliminate a need for other components for connection, and as compared with the above-described connection method in the related art, it is possible to facilitate position alignment of the voltage detection terminal and the conductive plate and to reduce contact resistance at a contact point. Further, when the output electric wire is connected to the voltage detection terminal and the electric wire is routed in the housing, the electric wire can be maintained in an appropriately routed state by, for example, preventing the positional deviation or the like of the electric wire by the extension piece of the cover. The extension piece may be used for another purpose (for example, engagement between the housing and the cover). Therefore, the voltage detection unit of the present configuration is excellent in the workability of the conductive connection with the detection target.

Further, according to the voltage detection unit having the configuration described above, when the cover is attached to the housing, even if the extension piece of the cover and the accommodating hole of the housing are offset in a direction intersecting the attachment direction (that is, even if the axial deviation occurs), when the extension piece comes into contact with the inclined surface of the guide portion of the housing, the axial deviation is reduced as the extension piece approaches the accommodating hole. Further, the extension piece can be properly guided to the accommodating hole by the guide surface continuous with the inclined surface. Therefore, the workability of the operation of attaching the cover to the housing is improved.

The cover (30) may include a locking portion (36) configured to engage with a predetermined portion (55, 56) of the housing (40) and to restrict movement of the cover (30) along the first direction. The guide portion (57) may be disposed such that the extension piece (35) is located between the predetermined portion (55, 56) and the guide portion (57).

With this configuration, in a state where the locking portion of the cover is engaged with the predetermined portion of the housing, even if the cover gets displaced so as to rotate around the engagement point therebetween, such displacement (that is, rotational deviation) is prevented by the contact between the extension piece of the cover and the guide portion. As a result, it is possible to prevent the extension piece from coming out of the accommodating hole due to such rotational deviation.

The extension piece (35) may have a rectangular shape in which an extended end portion (35a) of the extension piece (35) is not chamfered.

With this configuration, the extension piece of the cover has a rectangular shape in which the extended end portion of the extension piece is not chamfered. Accordingly, the contact area (so-called engagement margin) between the inner wall of the accommodating hole and the extended end portion of the extension piece can be increased as compared with the case where the extended end portion of the extension piece has a chamfered (that is, tapered) shape. As a result, it is possible to prevent the extension piece from coming out of the accommodating hole in a more reliable manner due to the rotational deviation described above.

What is claimed is:

1. A voltage detection unit comprising:
   a voltage detection terminal configured to be conductively connected to a detection target;
   a housing having a plate shape and including a terminal accommodating concave configured to accommodate the voltage detection terminal; and a cover configured to be attached to the housing and to cover the voltage detection terminal accommodated in the terminal accommodating concave, wherein the cover includes an extension piece extending in a first direction in which the cover is attached to the housing, and wherein the housing includes an accommodating hole configured to start accommodating the extension piece as the cover moves in the first direction for the cover to be attached to the housing, and a guide portion including an inclined surface and a guide surface, wherein the inclined surface has a flat shape and has a first end in the first direction and a second end opposite to the first end and is inclined with respect to the first direction such that the first end is provided closer to the accommodating hole than the second end in a second direction perpendicular to the first direction and being parallel to a plane in which the housing having the plate shape extends, and wherein the guide surface is continuous with the inclined surface and an inner wall surface of the accommodating hole.

2. The voltage detection unit according to claim 1, wherein the cover includes a locking portion configured to engage with a predetermined portion of the housing and to restrict movement of the cover along the first direction, and wherein the guide portion is disposed such that the extension piece is located between the predetermined portion and the guide portion.

3. The voltage detection unit according to claim 1, wherein the extension piece has a rectangular shape in which an extended end portion of the extension piece is not chamfered.

* * * * *